US012757530B2

(12) United States Patent
Wu et al.

(10) Patent No.: US 12,757,530 B2
(45) Date of Patent: Oct. 6, 2026

(54) LIGHT EMITTING DIODE AND LIGHT EMITTING DEVICE HAVING ELECTRODE EXTENSION STRIPS AND OHMIC CONTACT LAYER

(71) Applicant: Tianjin Sanan Optoelectronics Co., Ltd., Tianjin (CN)

(72) Inventors: Zhiwei Wu, Tianjin (CN); Yanyun Wang, Tianjin (CN); Weiping Xiong, Tianjin (CN); Di Gao, Tianjin (CN); Huanshao Kuo, Tianjin (CN); Yuren Peng, Tianjin (CN)

(73) Assignee: Tianjin Sanan Optoelectronics Co., Ltd., Tianjin (CN)

( * ) Notice: Subject to any disclaimer, the term of this patent is extended or adjusted under 35 U.S.C. 154(b) by 363 days.

(21) Appl. No.: 18/531,703

(22) Filed: Dec. 7, 2023

(65) Prior Publication Data

US 2024/0290912 A1 Aug. 29, 2024

(30) Foreign Application Priority Data

Feb. 28, 2023 (CN) ........................ 202310176103.2

(51) Int. Cl.
*H10H 20/831* (2025.01)
*H10H 20/832* (2025.01)

(52) U.S. Cl.
CPC ........ *H10H 20/831* (2025.01); *H10H 20/832* (2025.01)

(58) Field of Classification Search
None
See application file for complete search history.

(56) References Cited

U.S. PATENT DOCUMENTS

2014/0291714 A1* 10/2014 Jeon .................... H10H 20/814 257/98
2016/0240757 A1* 8/2016 Daikoku ............. H10H 20/831
2021/0005794 A1* 1/2021 Sakong ............... H10H 20/851
2021/0135058 A1* 5/2021 Niwa ..................... H10H 20/84
2021/0296536 A1* 9/2021 Wang .................. H10H 20/831
2023/0052304 A1* 2/2023 Shi ......................... H10H 20/01

* cited by examiner

*Primary Examiner* — Nilufa Rahim
(74) *Attorney, Agent, or Firm* — JCIPRNET

(57) ABSTRACT

A light emitting diode and a light emitting device are provided. The light emitting diode includes: a semiconductor epitaxial stacked layer at least including a first conductive type semiconductor layer, an active layer, and a second conductive type semiconductor layer and formed with a first mesa; a first contact electrode located on the first mesa and electrically connected to the first conductive type semiconductor layer; a second contact electrode located on the second conductive type semiconductor layer and electrically connected to the second conductive type semiconductor layer; and a first wiring electrode and a second wiring electrode located on the first contact electrode and the second contact electrode. Horizontal projections of the first wiring electrode and the second wiring electrode on the semiconductor epitaxial stacked layer fall within horizontal projections of the first contact electrode and the second contact electrode.

14 Claims, 4 Drawing Sheets

LIGHT EMITTING DIODE AND LIGHT EMITTING DEVICE HAVING ELECTRODE EXTENSION STRIPS AND OHMIC CONTACT LAYER

CROSS-REFERENCE TO RELATED APPLICATION

This application claims the priority benefit of China application serial no. 202310176103.2, filed on Feb. 28, 2023. The entirety of the above-mentioned patent application is hereby incorporated by reference herein and made a part of this specification.

BACKGROUND

Technical Field

The disclosure relates to a light emitting diode and belongs to the technical field of semiconductor optoelectronic devices.

Description of Related Art

With advantages such as high luminous intensity, high efficiency, small size, and long service life, light emitting diodes (LEDs) are considered to be one of the most promising light sources at present. In recent years, LEDs have been widely used in daily life, such as lighting, signal display, backlight, car lights, and large-screen display. These applications in turn have put forward higher requirements on the brightness, luminous efficiency, and reliability of LEDs.

For horizontally structured LEDs, the design of the wiring electrodes is an important structure that affects the optical and electrical properties of LEDs. The main factors that affect the wiring reliability are: (1) the surface flatness of the wiring electrodes; and (2) the effective dispersion of the impact force applied on the electrodes during the wire process. The factors that affect the light extraction efficiency mainly include: (1) the shielding used for packaging the wiring electrodes; (2) reflection at the interfaces of materials with different refractive indexes during the light output process; and (3) the absorption of light by various materials during the light output process.

In order to solve the above problems found in LEDs, a solution that can effectively improve both the wiring reliability and the light emission efficiency of LEDs is required to be provided.

SUMMARY

In order to solve the above problems and improve the reliability and luminous efficiency of the light emitting diodes, the disclosure provides a light emitting diode. The light emitting diode includes a semiconductor epitaxial stacked layer, a first contact electrode, a second contact electrode, a first wiring electrode, and a second wiring electrode. The semiconductor epitaxial stacked layer at least includes a first conductive type semiconductor layer, an active layer, and a second conductive type semiconductor layer stacked in sequence. The semiconductor epitaxial stacked layer is formed with a first mesa, and the first mesa exposes the first conductive type semiconductor layer. The first contact electrode is located on the first mesa and is electrically connected to the first conductive type semiconductor layer. The second contact electrode is located on the second conductive type semiconductor layer and is electrically connected to the second conductive type semiconductor layer. The first wiring electrode and the second wiring electrode are located on the first contact electrode and the second contact electrode. Herein, horizontal projections of the first wiring electrode and the second wiring electrode on the semiconductor epitaxial stacked layer fall within horizontal projections of the first contact electrode and the second contact electrode on the semiconductor epitaxial stacked layer.

The disclosure further provides a light emitting device including the abovementioned light emitting diode.

In the light emitting diode provided by the disclosure, by arranging the wiring electrodes on the contact electrodes and arranging the projections of the wiring electrodes on the semiconductor epitaxial stacked layer in the horizontal direction to fall within the horizontal projections of the contact electrodes, the wiring electrodes are ensured to be in good contact with the contact electrodes. Further, the areas of the contact electrodes are greater than the areas of the wiring electrodes, and since the force-bearing areas become larger during the wiring process, the impact force of wiring may be effectively dispersed, so the reliability of the light emitting diode is improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiment 1

Figure 1:
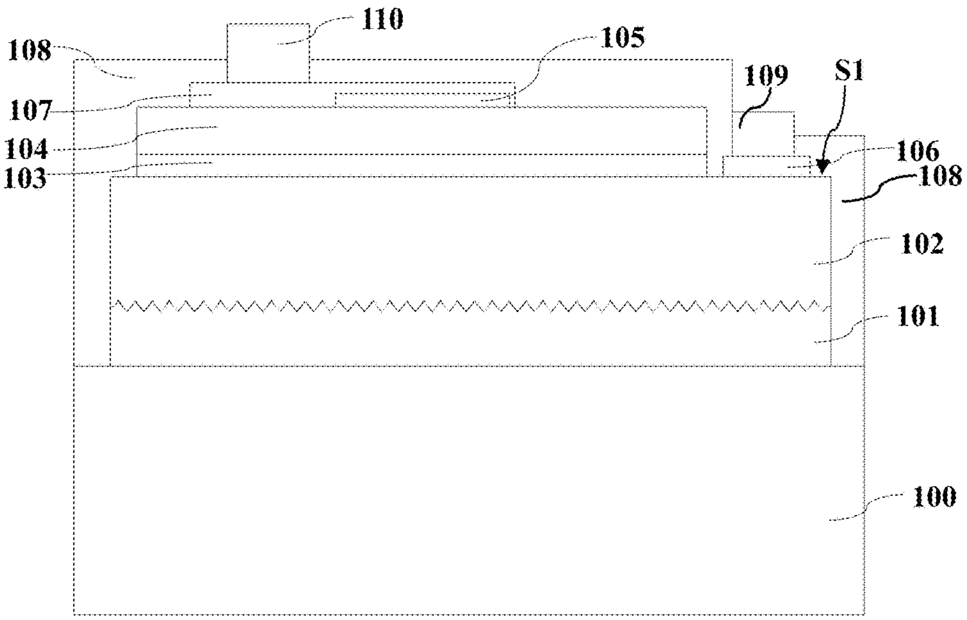
FIG. 1 is a schematic cross-sectional view of a structure of a light emitting diode provided in Embodiment 1 of the disclosure.
Figure 2:
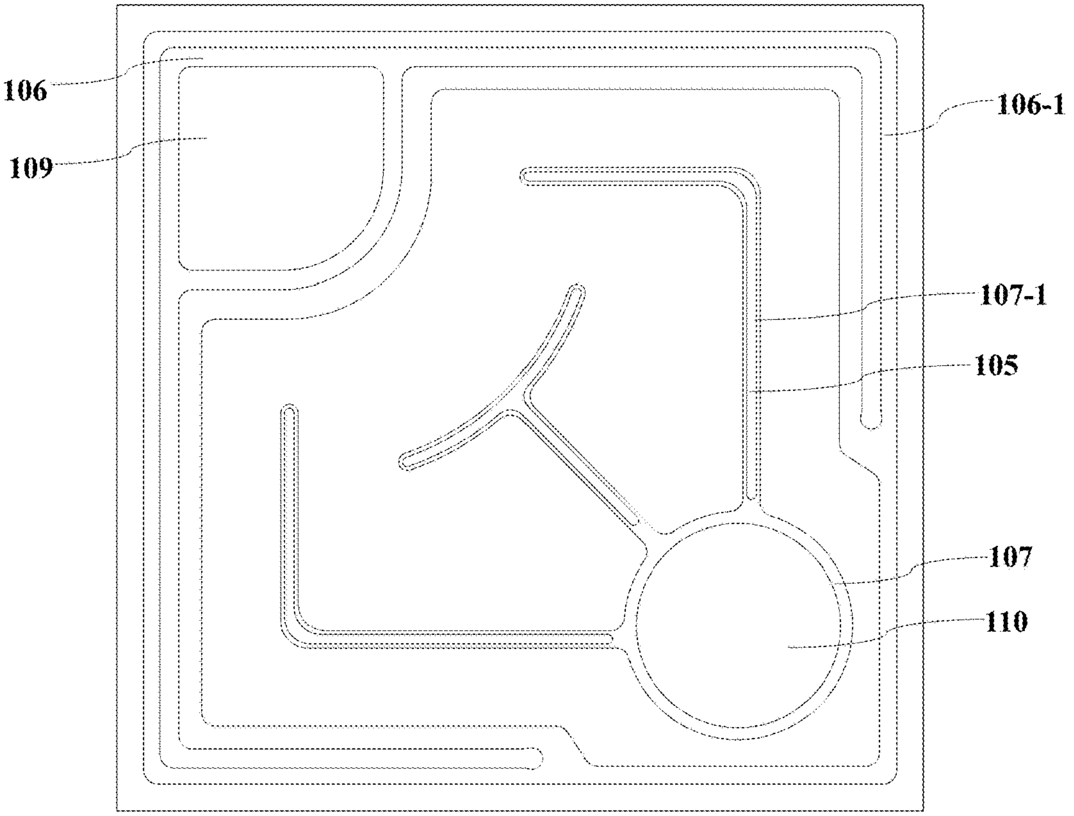
FIG. 2 is a schematic top view of the structure of the light emitting diode provided in Embodiment 1 of the disclosure.

FIG. 1 and FIG. 2 are a schematic cross-sectional view and a schematic top view of a structure of a light emitting diode chip (or light emitting diode) according to an embodiment of the disclosure.

With reference to FIG. 1, in order to achieve at least one or other advantages of the disclosure, an embodiment of the disclosure provides a light emitting diode chip including the following stacked layers: a substrate 100, a bonding layer 101, a first conductive type semiconductor layer 102, an active layer 103, a second conductive type semiconductor layer 104, an ohmic contact layer 105, a first contact electrode 106, a second contact electrode 107, a second electrode extension strip 107-1, an insulating layer 108, a first wiring electrode 109, and a second wiring electrode 110.

The light emitting diode chip may be a light emitting diode chip of a conventional size. The light emitting diode chip may have a horizontal cross-sectional area of approximately 90,000 $\mu m^2$ or greater and approximately 2,000,000 $\mu m^2$ or less.

The light emitting diode chip may also be a small-sized or micro-sized light emitting diode chip. The light emitting diode chip may have a horizontal cross-sectional area of approximately 90,000 $\mu m^2$ or less. For instance, the light emitting diode chip may have a length and/or width of 100 μm or greater and 300 μm or less, and further may have a thickness of 40 μm or greater and 100 μm or less.

The light emitting diode chip may also be a micro light emitting diode chip of a smaller size. The light emitting diode chip may have a horizontal cross-sectional area of approximately 10,000 $\mu m^2$ or less. For instance, the light emitting diode chip may have a length and/or width of 2 μm or greater and 100 μm or less, and further may have a thickness of 2 μm or greater and 100 μm or less. The light emitting diode chip of this embodiment may have the abovementioned horizontal cross-sectional area and thickness, so the light emitting diode chip may be easily applied to various electronic devices requiring small and/or micro light emitting devices.

With reference to FIG. 1 again, a semiconductor epitaxial stacked layer has a first surface and a second surface opposite to the first surface. The semiconductor epitaxial stacked layer is obtained by MOCVD or other growth methods and is a semiconductor material capable of providing conventional radiation such as ultraviolet, blue, green, yellow, red, infrared light, etc. To be specific, the semiconductor epitaxial stacked layer may be a material (e.g., common nitride) that provides radiation in the 200 nm to 950 nm band and is a gallium nitride-based semiconductor epitaxial stack. The gallium nitride-based epitaxial stacked layer is commonly doped with elements such as aluminum and indium and mainly provides radiation in the 200 nm to 550 nm band. Alternatively, the semiconductor epitaxial stacked layer is a common aluminum gallium indium phosphorus-based or aluminum gallium arsenic-based semiconductor epitaxial stacked layer mainly providing radiation in the 550 nm to 950 nm band.

The semiconductor epitaxial stacked layer includes the first conductive type semiconductor layer 102, the second conductive type semiconductor layer 104, and the active layer 103 located between the first conductive type semiconductor layer 102 and the second conductive type semiconductor layer 104. The semiconductor epitaxial stacked layer has a first mesa S1, and the first mesa S1 exposes the first conductive type semiconductor layer 102.

The first conductive type semiconductor layer 102 and the second conductive type semiconductor layer 104 have different conductivity types, electrical properties, or polarities, or are doped with elements to provide electrons or holes. That is, the first conductive type semiconductor layer 102 has a first conductivity, the second conductive type semiconductor layer 104 has a second conductivity, and the first conductivity and the second conductivity are different. For instance, the first conductive type semiconductor layer 102 may be a p-type semiconductor layer, and the second conductive type semiconductor layer 104 may be an n-type semiconductor layer, and vice versa. Driven by an externally applied current, electrons from the n-type semiconductor layer and holes from the p-type semiconductor layer convert electrical energy into light energy in the active layer 103 and emit light.

In this embodiment, a material of the semiconductor epitaxial stacked layer is a gallium arsenide (GaAs) series material. The doping of the first conductive type semiconductor layer 102 is p-type, and the doping of the second conductive type semiconductor layer 104 is n-type.

In other embodiments disclosed by the disclosure, a material of the first conductive type semiconductor layer 102 includes a II-VI group material (e.g., zinc selenide (ZnSe)) or a III-V nitrogen group compound material (e.g., gallium arsenide (GaAs), gallium nitride (GaN), aluminum nitride (AlN), indium nitride (InN), indium gallium nitride (InGaN), aluminum gallium nitride (AlGaN), or aluminum indium gallium nitride (AlInGaN)). Further, the material of the first conductive type semiconductor layer 102 may also include dopants such as magnesium (Mg) and carbon (C), but the embodiments of the disclosure are not limited thereto. In some other embodiments, the first conductive type semiconductor layer 102 may also be a single-layer or multi-layer structure.

In other embodiments disclosed by the disclosure, a material of the second conductive type semiconductor layer 104 includes a III-V nitrogen group compound material (for example, gallium arsenide (GaAs), gallium nitride (GaN), aluminum nitride (AlN), indium nitride (InN), indium gallium nitride (InGaN), aluminum gallium nitride (AlGaN), or aluminum indium gallium nitride (AlInGaN)). Further, the material of the second conductive type semiconductor layer 104 may include dopants such as silicon (Si) or germanium (Ge), but the embodiments of the disclosure are not limited thereto. In some other embodiments, the second conductive type semiconductor layer 104 may also be a single-layer or multi-layer structure.

In this embodiment, the active layer 103 uses a gallium arsenide (GaAs) series semiconductor material. To be specific, when being based on aluminum indium gallium phosphide (AlGaInP) series and gallium arsenide (GaAs) series semiconductor materials, the active layer 103 may emit red light, orange light, or yellow light. When being based on an aluminum gallium indium nitride (AlGaInN) series semiconductor material, the active layer 103 may emit blue light or green light. In some embodiments of the disclosure, the active layer 103 may include at least one un-doped semiconductor layer or at least one low-doped layer. In some embodiments of the disclosure, the active layer 103 may be a single heterostructure (SH), a double heterostructure (DH), a double-sided double heterostructure (DDH), or a multi-quantum well structure (MQW), but the embodiments of the disclosure are not limited thereto.

With reference to FIG. 1 again, the semiconductor epitaxial stacked layer is bonded to the substrate 100 through the bonding layer 101. Preferably, a side of the semiconductor epitaxial stacked layer facing the substrate 100 is formed into a rough surface to reduce the number of reflections during light output and to improve the brightness of the light emitting diode. In this embodiment, the substrate 100 is a sapphire substrate. The substrate 100 may be a transparent substrate, and a material of the transparent substrate includes an inorganic material or an III-V group semiconductor material. The inorganic material includes silicon carbide (SiC), germanium (Ge), sapphire, lithium aluminate ($LiAlO_2$), zinc oxide (ZnO), glass, or quartz. The III-V group semiconductor material includes indium phosphide (InP), gallium phosphide (GaP), gallium nitride (GaN), and aluminum nitride (AlN) materials. The substrate 100 has sufficient strength to mechanically support the semiconductor epitaxial stacked layer and can transmit light emitted from the semiconductor epitaxial stacked layer. A thickness of the substrate 100 is preferably 50 μm or greater. In addition, in order to facilitate the mechanical processing of the substrate 100 after bonding to the semiconductor epitaxial stacked layer is performed, the thickness is preferably not greater than 300 μm.

It should be noted that the light emitting diode chip of the disclosure is not limited to including only one semiconductor epitaxial stacked layer, but may also include multiple semiconductor epitaxial stacked layers located on the substrate 100. A wire structure may be provided between the plurality of semiconductor epitaxial stacked layers, so that the plurality of semiconductor epitaxial stacked layers are electrically connected to each other in series, in parallel, in series-parallel, etc. on the substrate 100.

A material of the bonding layer 101 may be an insulating material and/or a conductive material. The insulating material includes but not limited to polyimide (PI), benzocyclobutene (BCB), perfluorocyclobutane (PFCB), magnesium oxide (MgO), Su8, epoxy resin (epoxy), acrylic resin, cyclic olefin polymer (COC), polymethyl methacrylate (PMMA), polyethylene terephthalate (PET), polycarbonate (PC), polyetherimide, fluorocarbon polymer, glass, alumina ($Al_2O_3$), silicon oxide ($SiO_x$), titanium oxide ($TiO_2$), tantalum oxide ($Ta_2O_5$), silicon nitride ($SiN_x$), or spin-on glass (SOG). The conductive material includes but not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), zinc oxide (ZnO), indium zinc oxide (IZO), diamond-like carbon film (DLC), or gallium zinc oxide (GZO), etc. When the bonding layer 101 uses the conductive material to contact the first conductive type semiconductor layer 102, it can function as a current spreading layer, so that the current spreading effect is improved and the uniformity of current distribution is enhanced.

In some embodiments, a refractive index of the bonding layer 101 is preferably between a refractive index of the first conductive type semiconductor layer 102 and a refractive index of the substrate 100. For instance, the first conductive type semiconductor layer 102 has a refractive index n1, the bonding layer 100 has a refractive index n2, and the substrate 100 has a refractive index n3, where refractive index n1>refractive index n2>refractive index n3. In some embodiments, the refractive index of the bonding layer 100 ranges from 1.2 to 3. The bonding layer 101 may be a single-layer structure or a multi-layer structure.

In order to arrange the first contact electrode 106 and the second contact electrode 107 to be described in the following paragraphs on a same side of the first conductive type semiconductor layer 102 and the second conductive type semiconductor layer 104, the second conductive type semiconductor layer 104 may be formed on the first conductive type semiconductor layer 102 in such a manner that a portion of the first conductive type semiconductor layer 102 is exposed. Alternatively, the first conductive type semiconductor layer 102 may be formed on the second conductive type semiconductor layer 104 in such a manner that a portion of the second conductive type semiconductor layer 104 is exposed. For instance, with reference to FIG. 1 again, in this embodiment, the semiconductor epitaxial stacked layer includes the first mesa S1 that at least partially penetrates the second conductive type semiconductor layer 104 and the active layer 103 to expose the first conductive type semiconductor layer 102.

The light emitting diode chip includes one or more first contact electrodes 106 located on the first conductive type semiconductor layer 102 and electrically connected to the first conductive type semiconductor layer 102 directly or indirectly and one or more second contact electrodes 107 located on the second conductive type semiconductor layer 104 and electrically connected to the second conductive type semiconductor layer 104 directly or indirectly. When the first conductive type semiconductor layer 102 is p-type, the first contact electrode 106 refers to a p-type contact electrode. When the first conductive type semiconductor layer 102 is n-type, the first contact electrode 106 refers to an n-type contact electrode. The second contact electrode 106 is opposite to the first contact electrode 107. In this embodiment, it is preferred that the first contact electrode 106 is a p-type contact electrode.

The first contact electrode 106 and the second contact electrode 107 may be metal electrodes. For instance, the first contact electrode 106 and the second contact electrode 107 include Au, Ge, Ni, Zn, Be, an alloy of any combination thereof, or a stacked layer of any combination thereof. The first contact electrode 106 is preferably an alloy composed of Au, Zn, or Be, or a stacked layer of any combination thereof. The second contact electrode 107 is preferably an alloy composed of Au, Ge, or Ni, or a stacked layer of any combination thereof. Thicknesses of the first contact electrode 106 and the second contact electrode 107 are 0.5 μm to 3 μm, preferably more than 1 μm, to ensure that the first contact electrode 106 and the second contact electrode 107 form good ohmic contact with the semiconductor epitaxial stacked layer.

The insulating layer 108 covers an upper surface and a side surface of the semiconductor epitaxial stacked layer and covers the first contact electrode 106 and the second contact electrode 107. Further, the insulating layer 108 may be formed to extend and cover an upper surface of the substrate 100 that is partially exposed around the semiconductor epitaxial stacked layer. In this way, the insulating layer 108 may be in contact with the upper surface of the substrate 100 and therefore may more stably cover the side surface of the semiconductor epitaxial stacked layer. The insulating layer 108 is used to protect the semiconductor epitaxial stacked layer from moisture or contaminants, so that the optical and electrical properties of the semiconductor epitaxial stacked layer are ensured. The insulating layer may be a single-layer structure or a multi-layer structure, and the insulating layer may be composed of $SiO_2$, $SiN_x$, $Al_2O_3$, and other materials.

The insulating layer 108 has a first opening and a second opening, and the first wiring electrode 109 and the second wiring electrode 110 are arranged on an upper portion of the insulating layer 108. The first wiring electrode 109 may be electrically connected to the first contact electrode 106 through the first opening of the insulating layer 108. The second wiring electrode 110 may be electrically connected to the second contact electrode 107 through the second opening. The first opening and the second opening may be circular in shape, but the first opening and the second opening may also be square and the like in some other embodiments. The shape and number of the openings are not particularly limited, and only one opening may be provided. If a plurality of openings are provided, the current may be dispersed more evenly. In addition, in some other embodiments, when a plurality of openings are provided, the openings may be distributed at equal or non-equal intervals according to actual needs, and are not limited to the embodiments disclosed in the disclosure. In some embodiments, the first wiring electrode 109 includes Ti, Al, Pt, Au, Ni, Sn, an alloy of any combination thereof, or a stacked layer of any combination thereof. In some embodiments, the second wiring electrode 110 includes Ti, Al, Pt, Au, Ni, Sn, an alloy of any combination thereof, or a stacked layer of any combination thereof. Thicknesses of the first wiring electrode 109 and the second wiring electrode 110 are 1 μm to 5 μm, preferably 3 μm to 4 μm.

In order to effectively disperse the impact force suffered by the electrodes during the wiring process and improve the wiring reliability of the light emitting diode, in this embodiment, horizontal projections of the first wiring electrode 109 and the second wiring electrode 110 on the semiconductor epitaxial stacked layer are arranged to fall within horizontal projections of the first contact electrode 106 and the second contact electrode 107 on the semiconductor epitaxial stacked layer. In some optional embodiments, areas of the horizontal projections of the first wiring electrode 109 and the second wiring electrode 110 on the semiconductor epitaxial stacked layer are preferably less than areas of the horizontal projections of the first contact electrode 106 and the second contact electrode 107 on the semiconductor epitaxial stacked layer. Preferably, the areas of the horizontal projections of the first wiring electrode 109 and the second wiring electrode 110 on the semiconductor epitaxial stacked layer are 50% to 99%, preferably more than 60%, and more preferably more than 70% or 80%, of the areas of the horizontal projections of the first contact electrode 106 and the second contact electrode 107 on the semiconductor epitaxial stacked layer. In this way, a sufficient contact area is ensured to be provided between the first contact electrode and the first wiring electrode to facilitate the spreading of current.

With reference to FIG. 2, the light emitting diode further includes a first electrode extension strip 106-1 and a second electrode extension strip 107-1 located on the semiconductor epitaxial stacked layer. The first electrode extension strip 106-1 and the second electrode extension strip 107-1 are connected to the first contact electrode 106 and the second contact electrode 107.

Optionally, the first electrode extension strip 106-1 and the second electrode extension strip 107-1 are linearly distributed on the semiconductor epitaxial stacked layer. Optionally, ends of the first electrode extension strip 106-1 and the second electrode extension strip 107-1 are designed to be smooth arc shapes, and in this way, current spreading is ensured, and further, the arc-shaped ends may lower charge accumulation and the risk of ESD breakdown is also decreased.

The horizontal projections of the first electrode extension strip 106-1 and the second electrode extension strip 107-1 on the semiconductor epitaxial stacked layer do not overlap the horizontal projections of the first wiring electrode 109 and the second wiring electrode 110.

In some optional embodiments, the second conductive type semiconductor layer 104 includes the ohmic contact layer 105. The ohmic contact layer 105 is located below the second electrode extension strip 107-1 and has a patterned structure. The ohmic contact layer 105 may form good ohmic contact with the second electrode extension strip 107-1. A length of the ohmic contact layer 105 may be equal to or shorter than the second electrode extension strip 107-1, and a width may be equal to or shorter than the second electrode extension strip 107-1. For instance, the width of the ohmic contact layer 105 may be 3 μm to 9 μm. As a better implementation, as shown in FIG. 1, the ohmic contact layer 105 is not located below a through hole of the insulating layer 108. A specific distance is provided between one end of the linear ohmic contact layer 105 and the through hole of the insulating layer 108. Optionally, the other end of the ohmic contact layer 105 and the second electrode extension strip 107-1 may or may not be aligned. Optionally, for instance, when the second contact electrode 107 is an N-type electrode, the ohmic contact layer 105 may be gallium arsenide doped to be N-type. The ohmic contact layer 105 has a linear structure, so that the light absorption of the ohmic contact layer 105 may be reduced, and the luminous efficiency of the light emitting diode may thus be improved. Optionally, the horizontal projection of the second wiring electrode does not overlap a horizontal projection of the ohmic contact layer.

In the light emitting diode provided by this embodiment, by arranging the wiring electrodes on the contact electrodes and arranging the projections of the wiring electrodes on the semiconductor epitaxial stacked layer in a horizontal direction to fall within the horizontal projections of the contact electrodes, the wiring electrodes are ensured to be in good contact with the contact electrodes. Further, the areas of the contact electrodes are greater than that of the wiring electrodes, and since the force-bearing areas become larger during the wiring process, the impact force of wiring may be effectively dispersed, so the reliability of the light emitting diode is improved.

Embodiment 2

The process for manufacturing the light emitting diode of the abovementioned Embodiment 1 is described in detail in the following paragraphs.

Figure 3:
FIG. 3 to FIG. 7 are schematic views of structures in a fabrication process of a light emitting diode provided in Embodiment 2 of the disclosure.

With reference to FIG. 3, the semiconductor epitaxial stacked layer is formed on a growth substrate 10. Generally, various known methods may be used for growth, such as metal organic chemical vapor deposition (MOCVD), molecular beam epitaxy (MBE), or hydride vapor phase epitaxy (HVPE). The growth substrate 10 is a gallium arsenide substrate. The semiconductor epitaxial stacked layer is a gallium arsenide (GaAs) series material and includes the first conductive type semiconductor layer 102, the second conductive type semiconductor layer 104, and the active layer 103 located between the first conductive type semiconductor layer 102 and the second conductive type semiconductor layer 104.

Figure 4:
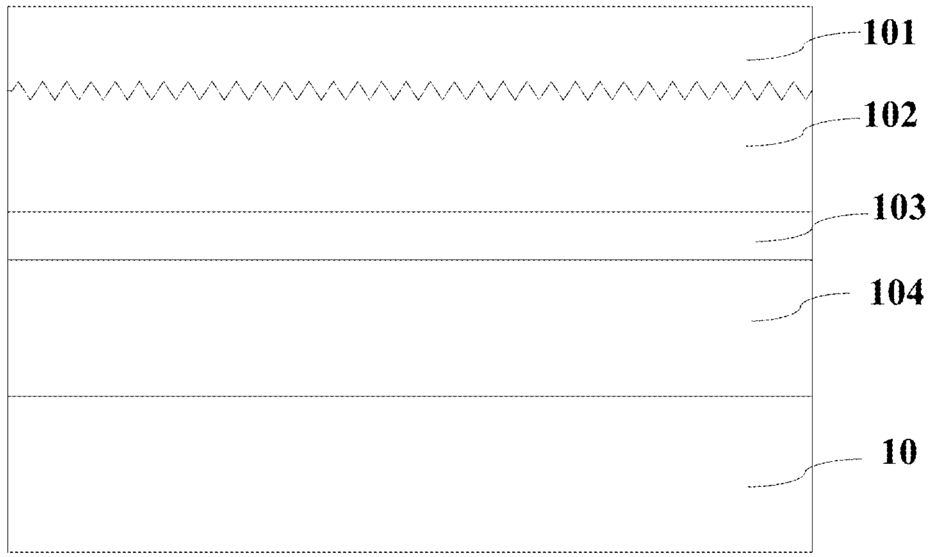

With reference to FIG. 4, a roughened surface is formed on a surface of the first conductive type semiconductor layer 102 through a roughening process. The method of forming the roughened surface is not particularly limited, and etching or mechanical polishing may be used, for example. The bonding layer 101 is deposited on the roughened surface of the first conductive type semiconductor layer 102, and a surface of the bonding layer 101 is polished. The material of the bonding layer 101 is preferably silicon dioxide.

Figure 5:
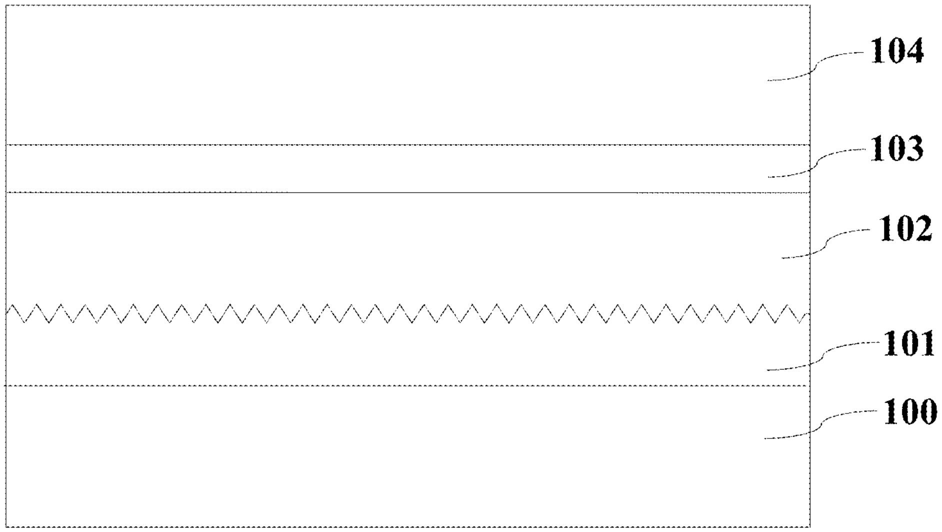

With reference to FIG. 5, the semiconductor epitaxial stacked layer and the substrate 100 are bonded through the bonding layer 101 first. The substrate 100 is a sapphire substrate. The growth substrate 10 is then removed.

Figure 6:
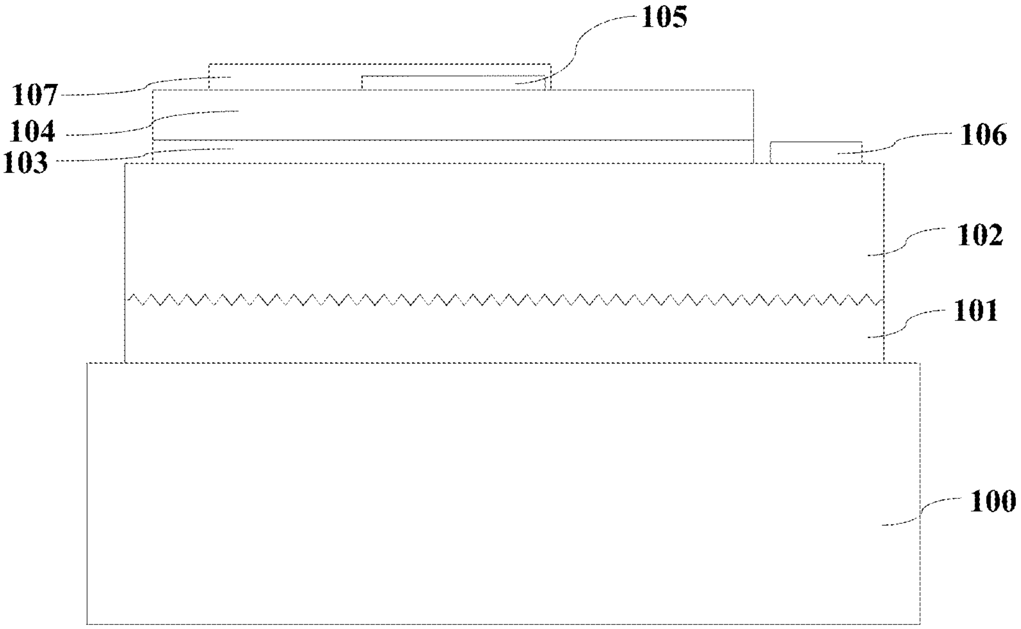

With reference to FIG. 6, a photoresist pattern is formed on the defined surface of the semiconductor epitaxial stacked layer. The second conductive type semiconductor layer 104 and the active layer 103 are removed from part of a surface of the second conductive type semiconductor layer 104 until part of the first conductive type semiconductor layer 102 is exposed, and the first mesa is formed. The ohmic contact layer 105 of the second conductive type semiconductor layer is patterned, and then the first contact electrode 106 and the second contact electrode 107 are respectively formed on the first mesa and the second conductive type semiconductor layer.

Figure 7:
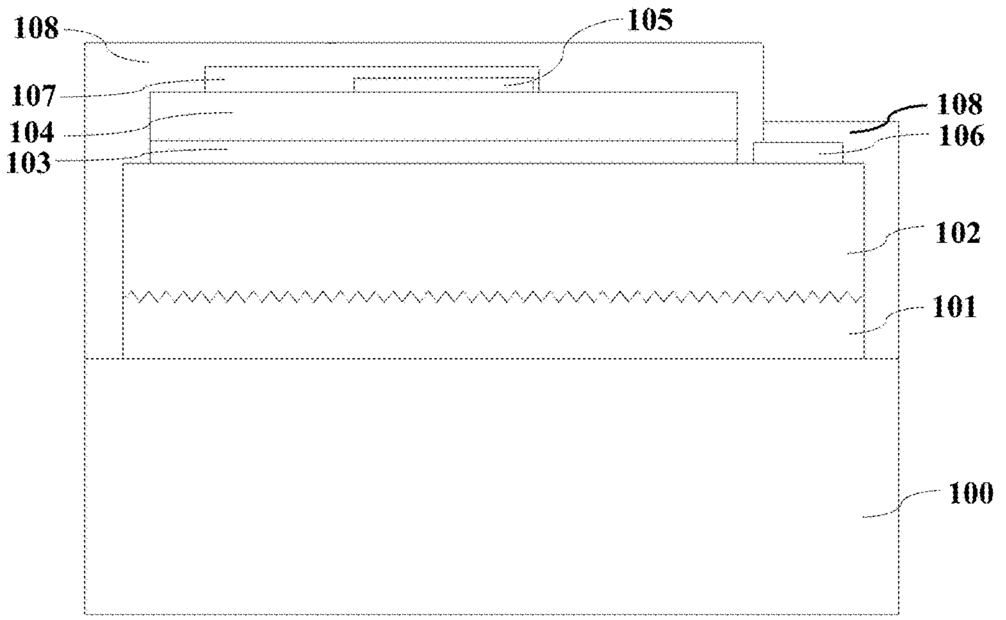

With reference to FIG. 7, the insulating layer 108 is deposited, and the insulating layer 108 completely covers the surface and side walls of the semiconductor epitaxial stacked layer as well as the exposed surface of the bonding layer 101.

Next, the first opening and the second opening are formed in the insulating layer 108 located on the first conductive type semiconductor layer 102 and the second conductive type semiconductor layer 104 respectively. The first wiring electrode 109 and the second wiring electrode 110 are fabricated and electrically connected to the first conductive type semiconductor layer 102 and the second conductive type semiconductor layer 104 through the corresponding first opening and the second opening, respectively. The light emitting diode as shown in FIG. 1 is obtained.

In the light emitting diode fabricated through the method provided by this embodiment, since the projections of the wiring electrodes on the semiconductor epitaxial stacked layer in the horizontal direction fall within the horizontal projections of the contact electrodes, the wiring electrodes are ensured to be in good contact with the contact electrodes. Further, the areas of the contact electrodes are greater than that of the wiring electrodes, and since the force-bearing areas become larger during the wiring process, the impact force of wiring may be effectively dispersed, so the reliability of the light emitting diode is improved.

Embodiment 3

Figure 8:
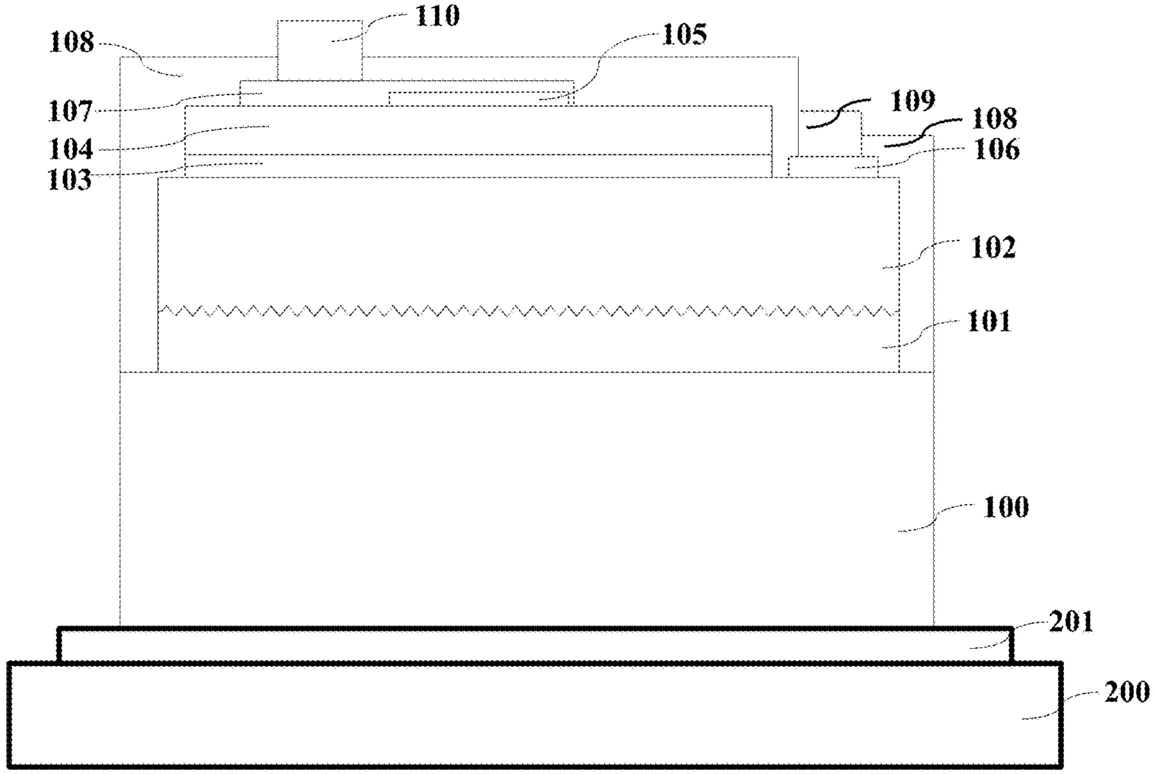
FIG. 8 is a schematic view of a structure of a light emitting device provided in Embodiment 3 of the disclosure.

This embodiment provides a light emitting device. As shown in FIG. 8, the light emitting device includes a die-bonding substrate 200 and a light emitting diode located on the die-bonding substrate 200. The light emitting diode may be the light emitting element provided in Embodiment 1 of the disclosure. The die-bonding substrate 200 may be a ceramic substrate, a printed circuit board, etc. A die-bonding region is provided above the die-bonding substrate 200, and the die-bonding region exhibits a good reflection effect. The light emitting diode is fixed to the die-bonding region. For instance, the light emitting diode is fixed to the die-bonding substrate 200 through a die-bonding adhesive 201 with a specific refractive index. Therefore, the light emitted by the light emitting element is more likely to be emitted onto the die-bonding substrate 200 through the die-bonding adhesive 201 and reflected by the die-bonding substrate 200, so that the light emission efficiency of the light emitting device is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light emitting diode, comprising:

a semiconductor epitaxial stacked layer at least comprising a first conductive type semiconductor layer, an active layer, and a second conductive type semiconductor layer stacked in sequence, wherein the semiconductor epitaxial stacked layer is formed with a first mesa, and the first mesa exposes the first conductive type semiconductor layer;

a first contact electrode located on the first mesa and electrically connected to the first conductive type semiconductor layer;

a second contact electrode located on the second conductive type semiconductor layer and electrically connected to the second conductive type semiconductor layer;

a first wiring electrode and a second wiring electrode located on the first contact electrode and the second contact electrode, wherein horizontal projections of the first wiring electrode and the second wiring electrode on the semiconductor epitaxial stacked layer fall within horizontal projections of the first contact electrode and the second contact electrode on the semiconductor epitaxial stacked layer;

a first electrode extension strip and a second electrode extension strip located on the semiconductor epitaxial stacked layer, wherein the first electrode extension strip and the second electrode extension strip are connected to the first contact electrode and the second contact electrode; and an ohmic contact layer in direct contact with the second conductive type semiconductor layer, wherein the ohmic contact layer is completely covered by the second electrode extension strip and has a patterned structure corresponding to the second electrode extension strip.

2. The light emitting diode according to claim 1, wherein areas of the horizontal projections of the first wiring electrode and the second wiring electrode on the semiconductor epitaxial stacked layer are less than areas of the horizontal projections of the first contact electrode and the second contact electrode on the semiconductor epitaxial stacked layer.

3. The light emitting diode according to claim 1, wherein areas of the horizontal projections of the first wiring electrode and the second wiring electrode on the semiconductor epitaxial stacked layer are 50% to 99% of areas of the horizontal projections of the first contact electrode and the second contact electrode on the semiconductor epitaxial stacked layer.

4. The light emitting diode according to claim 1, further comprising:

an insulating layer having a first opening and a second opening, wherein the first wiring electrode and the second wiring electrode are electrically connected to the first contact electrode and the second contact electrode through the first opening and the second opening.

5. The light emitting diode according to claim 1, wherein the first wiring electrode and the second wiring electrode comprise Ti, Al, Pt, Au, Ni, Sn, In, an alloy of any combination thereof, or a stacked layer of any combination thereof.

6. The light emitting diode according to claim 1, wherein the first contact electrode and the second contact electrode comprise Au, Ge, Ni, Zn, Be, an alloy of any combination thereof, or a stacked layer of any combination thereof.

7. The light emitting diode according to claim 1, wherein thicknesses of the first wiring electrode and the second wiring electrode are 1 μm to 5 μm.

8. The light emitting diode according to claim 1, wherein thicknesses of the first contact electrode and the second contact electrode are 0.5 μm to 3 μm.

9. The light emitting diode according to claim 1, wherein the first electrode extension strip and the second electrode extension strip are linearly distributed on the semiconductor epitaxial stacked layer, and horizontal projections of the first electrode extension strip and the second electrode extension strip on the semiconductor epitaxial stacked layer are not overlapped with the horizontal projections of the first wiring electrode and the second wiring electrode on the semiconductor epitaxial stacked layer.

10. The light emitting diode according to claim 1, wherein ends of the first electrode extension strip and the second electrode extension strip are designed to be smooth arc shapes.

11. The light emitting diode according to claim 1, wherein the ohmic contact layer is a doped semiconductor layer.

12. The light emitting diode according to claim 1, wherein the horizontal projection of the second wiring electrode is not overlapped with a horizontal projection of the ohmic contact layer.

13. The light emitting diode according to claim 1, wherein the light emitting diode radiates light with a wavelength of 550 nm to 950 nm.

14. A light emitting device comprising the light emitting diode according to claim 1.

* * * * *